United States Patent
Nakashima et al.

(10) Patent No.: US 6,795,363 B2
(45) Date of Patent: Sep. 21, 2004

(54) REFRESH CONTROL METHOD OF SEMICONDUCTOR MEMORY DEVICE AND SEMICONDUCTOR MEMORY DEVICE COMPRISING THE SAME CONTROL METHOD

(75) Inventors: Masami Nakashima, Kasugai (JP); Mitsuhiro Higashiho, Beppu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/260,302

(22) Filed: Oct. 1, 2002

(65) Prior Publication Data
US 2003/0112688 A1 Jun. 19, 2003

(30) Foreign Application Priority Data
Dec. 13, 2001  (JP) ..................................... 2001-379530

(51) Int. Cl.[7] ................................................ G11C 7/00
(52) U.S. Cl. ....................................... 365/222; 365/195
(58) Field of Search ............................. 365/222, 195, 365/196, 230.01, 233, 236, 189.01

(56) References Cited

U.S. PATENT DOCUMENTS

| 4,293,908 | A | * | 10/1981 | Bradley et al. ............... 710/22 |
| 4,849,936 | A | * | 7/1989 | Mizutani ................ 365/189.01 |
| 6,222,785 | B1 | * | 4/2001 | Leung ......................... 365/222 |
| 6,256,252 | B1 | * | 7/2001 | Arimoto ..................... 365/227 |
| 6,625,077 | B2 | * | 9/2003 | Chen .......................... 365/222 |
| 2004/0027876 | A1 | * | 2/2004 | Takahashi et al. .......... 365/200 |

* cited by examiner

Primary Examiner—Gene N. Auduong
(74) Attorney, Agent, or Firm—Arent Fox

(57) ABSTRACT

There are provided a semiconductor memory device and a refresh control method thereof to realize a refresh operation without any problem for external accesses while realizing low current dissipation operations for executing the refresh operation in separation from external access operation, in which the refresh operation is inhibited during execution of the external accesses. During this period, the internal operation in the refresh operation is controlled for the first refresh-operation-start request, but the internal operation for the second and subsequent refresh operation start requests is inhibited. Even when a plurality of refresh-operation-start requests are outputted previously while the refresh operation is inhibited during the external access operation, only the internal operation is not executed previously and the refresh operations after completion of the external access operation can surely be executed.

17 Claims, 15 Drawing Sheets

FIRST PRINCIPLE EXPLANATORY DIAGRAM OF PRESENT INVENTION

FIRST PRINCIPLE EXPLANATORY DIAGRAM OF PRESENT INVENTION

SECOND PRINCIPLE EXPLANATORY DIAGRAM OF PRESENT INVENTION

FIG.3 CIRCUIT BLOCK DIAGRAM OF FIRST EMBODIMENT

FIG.4 CIRCUIT BLOCK DIAGRAM OF SECOND EMBODIMENT

FIG.5 CIRCUIT BLOCK DIAGRAM SHOWING PRACTICAL EXAMPLE OF REFRESH-OPERATION-START REQUEST GENERATING CIRCUIT

FIG.6 CIRCUIT DIAGRAM SHOWING PRACTICAL EXAMPLE OF COUNT-UP MONITORING CIRCUIT

FIG.9 TIMING CHART OF SECOND EMBODIMENT

TIMING CHART SHOWING REFRESH OPERATION (1) OF RELATED ART

FIG.12 REFRESH-THINNING-OUT OPERATION

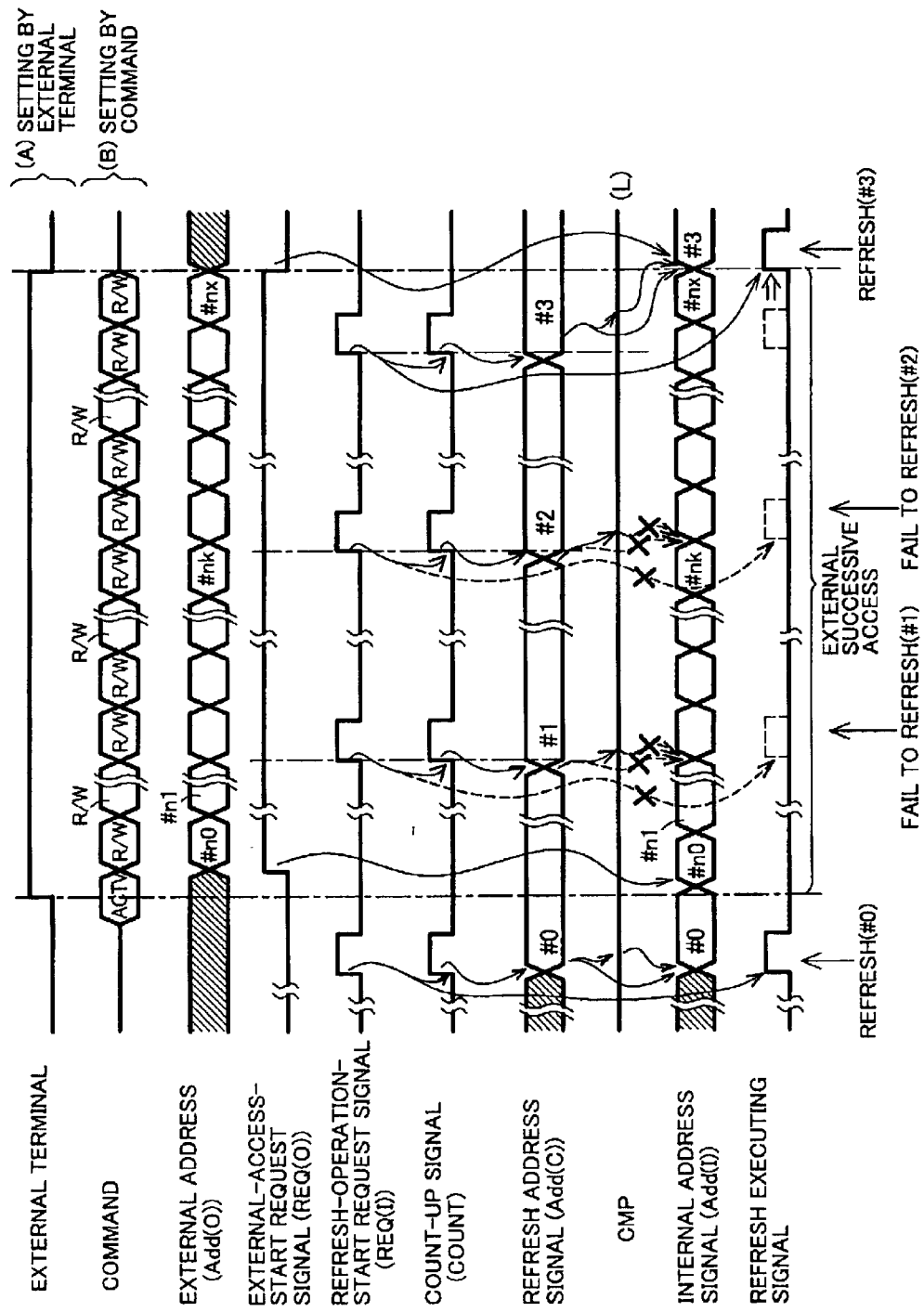

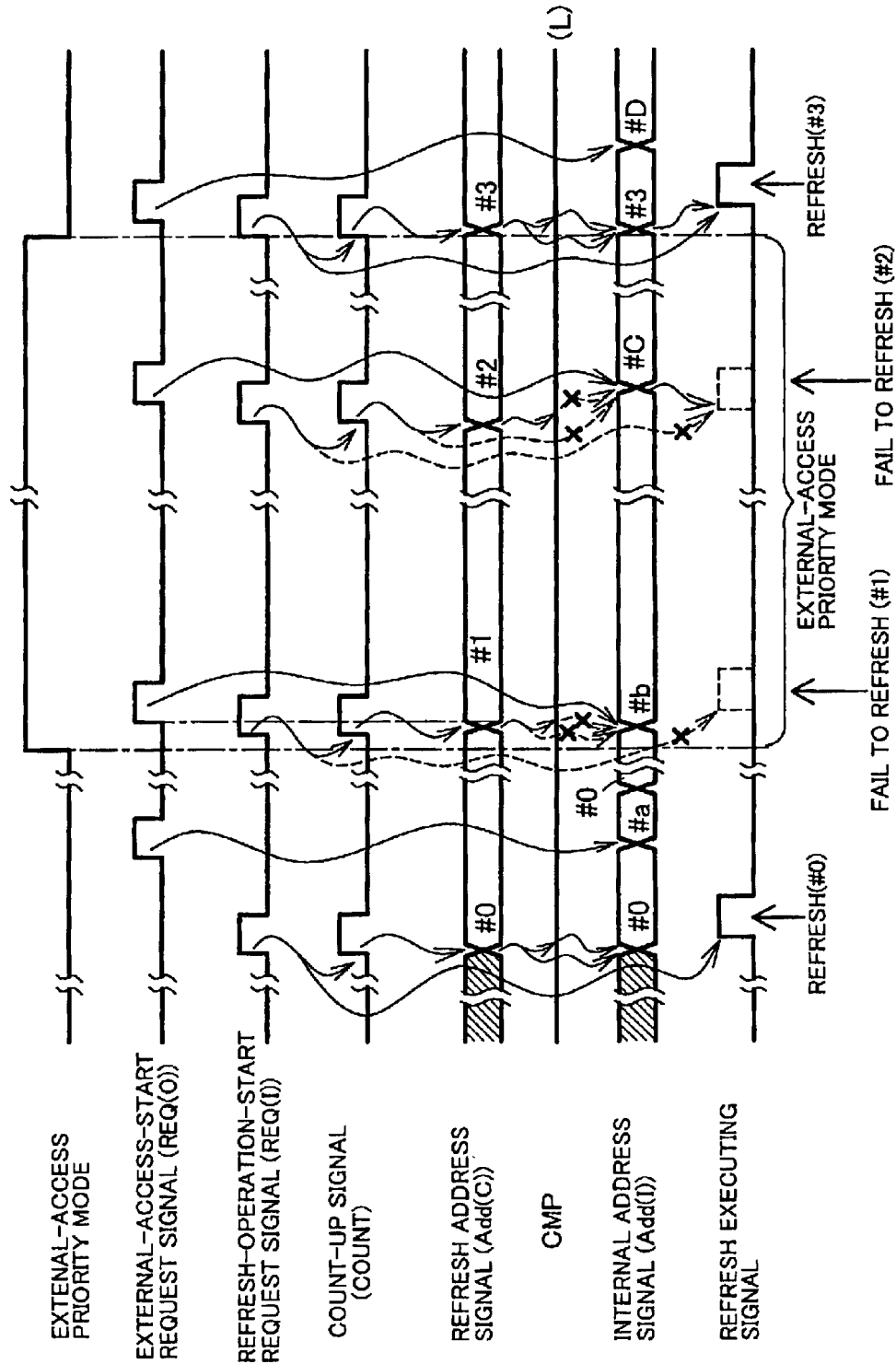
FIG.15 PROBLEMS GENERATED WHEN EXTERNAL ACCESS OPERATION PRIORITY MODE IS SET

REFRESH CONTROL METHOD OF SEMICONDUCTOR MEMORY DEVICE AND SEMICONDUCTOR MEMORY DEVICE COMPRISING THE SAME CONTROL METHOD

BACKGROUND OF THE INVENTION

1. Field of the Invention

The present invention relates to a semiconductor memory device which requires refresh operation and a refresh control method, and particularly to a semiconductor memory device which can control the refresh operation on the occasion of executing the refresh operation as an internal access operation independent of an external access operation and a refresh control method.

2. Description of Related Art

A semiconductor memory device represented by a dynamic random access memory (hereinafter referred to as DRAM) is required to periodically perform the refresh operation in order to maintain the data stored in a memory cell.

FIG. 10 shows operation waveforms in the so-called self-refresh operation which means the automatic refresh operation executed in every predetermined period in the standby state among the ordinary refresh operations in the related art. FIG. 10(A) indicates the control in the case of the asynchronous DRAM in which the self-refresh operation is executed in the CAS before RAS refresh operation. Namely, the self-refresh operation is controlled, for the external control signals /RAS and /CAS, with a signal transition sequence opposed to that of the ordinary access operation in which the /CAS signal is transitioned to a low logic level before the low logic level transition of the /RAS signal. The state of self-refresh operation can be maintained while the external control signals /RAS, /CAS are in the low logic level. Moreover, FIG. 10(B) indicates the control in the case of the synchronous DRAM (hereinafter referred to as SDRAM) in which the self-refresh operation is executed with a command input synchronized with a clock signal CLK. The self-refresh operation is started with a start command REF of the refresh operation and thereafter the self-refresh state is maintained. When a command EXIT is issued, the self-refresh state is canceled.

During the period of the self-refresh operation, an external access operation such as read and write of data is never conducted ((I) of FIG. 10) and the refresh operation as the internal access operation is continued. A count-up signal COUNT of a refresh address counter is outputted to a refresh-operation-start request signal REQ (I) which is outputted in the predetermined refresh period and a refresh address signal Add (C) is sequentially incremented. Thereafter, a refresh executing signal is outputted based on the refresh-operation-start request signal REQ (I) and the refresh operation is sequentially executed to the memory cell areas (memory cells connected to the predetermined word lines) indicated with the refresh address signal Add (C).

An ordinary self-refresh operation in the related art explained above is always controlled with the external control signals /RAS, /CAS or with the external commands REF, EXIT exclusive of the external access operation such as data read and write operations. Therefore, during the self-refresh operation period, the refresh-operation-start request signal REQ (I), count-up signal COUNT, refresh address signal Add (C) and refresh executing signal are respectively corresponding to each other on 1:1 basis and the address areas indicated by the refresh address signal Add(C) which is sequentially incremented in every refresh period is then sequentially selected.

In recent years, as a result of diversification of the functions required for the mobile devices with the rapid development thereof, the static random access memory (hereinafter referred to as SRAM) which has been loaded to the predecessors is now replaced with further large capacity memory. Therefore, from the necessity to load a large capacity memory explained above in the practical price in the limited space, a DRAM with built-in refresh function which is so-called a pseudo SRAM has been used. That is, a pseudo SRAM for controlling the refresh operation peculiar to the memory cell of DRAM or the like which assures high integration density and low bit price is built-in. Moreover, as a means to realize a synchronous SRAM (hereinafter referred to as SSRAM) with a memory cell of SDRAM for the requirement of high speed operation in future, the specification for the pseudo SSRAM has become a practical means in current.

Since the pseudo SRAM or pseudo SSRAM assures compatibility with SRAM or SSRAM in the circuit operations, it is specified to automatically execute the refresh operation whenever it is required. Therefore, the refresh operation as the internal access operation and an ordinary data read/write operation as the external access operation are executed independently in the desired timing.

FIG. 11 shows waveforms in the external access operation and the refresh operation of the pseudo SRAM in the related art. Since the refresh operation as the internal access operation is executed independent of the read/write operation as the external access operation, arbitration is required when both operations are overlapped. (II) of FIG. 11 indicates the overlap of the single refresh operation and external access operation. An external-access-start request signal REQ (O) is outputted with a delay from a refresh-operation-start request signal REQ (I). When the single refresh operation and single external access operation are overlapped, arbitration of access operation is conducted to execute any one single operation with a priority and then execute later the other single operation with a certain delay. In FIG. 11, the refresh operation for the refresh address #1 is executed with the priority and thereafter the external access operation is conducted for the address #b. The refresh operation is executed without any delay to the refresh-operation-start request signal REQ (I). Meanwhile, the external access operation is executed with a certain delay from the external-access-start request signal REQ (O).

(III) of FIG. 11 indicates the external successive access operation such as a page operation to be executed bridging over the refresh operation. The refresh-operation-start request signal REQ (I) is issued during the period of the continuous external-access-start request signal REQ (O). In general, since a high speed continuous access operation is required in the external successive access operation, execution of the refresh operation is inhibited until such continuous operation is completed and the arbitration is conducted to execute the refresh operation following the completion of the external successive access operation. The external successive access operation is executed with priority for the addresses #c to #c+k and thereafter the refresh operation is executed for the refresh address #3. The external successive access operation is executed without delay for the external-access-start request signal REQ (O). On the contrary, the refresh operation is executed with a delay from the refresh-operation-start request signal REQ (I).

Moreover, a mobile device is often placed under the standby state for a longer period such as a mobile phone and a digital camera, etc. and therefore this mobile device is always required to reduce the current dissipation up to the ultimate extent in the standby state in order to improve the continuous duration time characteristic while the device is operated with a battery. Therefore, it is an essential matter for a DRAM or the like to reduce the current dissipation in the refresh operation such as the self-refresh operation which is periodically conducted even during the standby state. As a method to reduce the current dissipation during the refresh operation, two kinds of methods, one is the refresh-thinning-out operation and the other is the partial refresh operation, have been proposed.

FIG. 12 shows the waveforms in the refresh operation corresponding to the refresh-thinning-out operation. In the case of the memory cells loaded to a semiconductor memory device, its electrical characteristic is generally given a predetermined width. The data holding characteristic stored in the memory cells also has a predetermined width and the refresh period tRF of the refresh operation must be set for the worst value of the data holding characteristic. Meanwhile, for the memory cells having the excellent data holding characteristic, it is enough when the refresh operation is executed in the period longer than the preset refresh period tRF. Therefore, it is set for the memory cells having excellent data holding characteristic that the refresh operation is conducted once for every two periods of the refresh period tRF. Thereby, the number of refresh operations per predetermined time is reduced and accordingly the current dissipation in the refresh operation can also be reduced.

In FIG. 12, the memory cells of the refresh address #1 correspond to such memory cells. The refresh operation is inhibited once for every two periods to execute the control of the refresh-thinning-out operation. For the control of the refresh-thinning-out operation, matching/miss-matching of address must be judged by previously storing the addresses of the memory cells having the excellent data holding characteristic to the internal storage means and then comparing such addresses with the refresh address signal Add(C) from the refresh address counter which is counted up for every refresh-operation-start request signal REQ (I). When the addresses are matched as a result of comparison, a comparison signal CMP is inverted to the high logic level to inhibit the refresh operation. Therefore, it is necessary prior to output of the refresh executing signal to count up a refresh counter with a count-up signal COUNT depending on the refresh-operation-start request signal REQ (I).

FIG. 13 shows the waveforms of the refresh operation corresponding to the partial refresh operation. In this partial refresh operation, the refresh operation is not executed to the predetermined memory cell region in the semiconductor device but only to the memory cell region which requires the data holding. Thereby, the number of the refresh operations per predetermined time can be reduced and the current dissipation in the refresh operation can also be lowered.

In FIG. 13, the memory cell areas of the addresses #k to #k+2 correspond to such partial refresh operation. The refresh operation is inhibited to these address areas but is executed to the other addresses. The control for inhibiting the refresh operation is executed in the same manner as the control for the refresh-thinning-out operation. Matching/miss-matching of address is judged by storing the addresses of the memory cell region which do not require the holding of data to the internal storage means and then comparing these addresses with the refresh address signal Add (C) from the refresh address counter which is counted up in every refresh-operation-start request signal REQ (I). When the addresses are matched as a result of comparison, a comparison signal CMP is inverted to a high logic level to inhibit the refresh operation. Therefore, it is necessary to count up the refresh address counter with a count-up signal COUNT depending on an output of the refresh-operation-start request signal REQ (I) prior to an output of the refresh executing signal.

However, there is a fear for generation of a couple of operational problems explained below when the external access operation and refresh operation are to be executed independently in the pseudo SRAM and pseudo SSRAM while reduction of current dissipation is realized in the standby state through the refresh-thinning-out operation and partial refresh operation. Therefore, when the semiconductor memory device which requires the refresh operation of DRAM and SDRAM or the like is used in the compatible specification for the SRAM of the pseudo SRAM and pseudo SSRAM as the semiconductor memory device for use in mobile devices, a problem rises here because it is impossible to simultaneously realize the low current dissipation performance in the standby state due to the refresh-thinning-out operation and partial refresh operation and the access performance of a large capacity data or high speed data access performance, which are executed independent of the refresh operation.

A first problem is illustrated in FIG. 14. With realization of further sophisticated system, the high speed transfer ability of a large capacity data is required and improvement in the data occupation rate of the I/O bus in the system is also required. In this case, the external successive access operation such as the random page operation and burst operation or the like is required to be continued for a long period of time. This continuation period is also considered to be lasted exceeding a plurality of refresh periods.

FIG. 14 illustrates an example wherein the external successive access operation is continued for the three refresh periods while the external address Add (O) is sequentially switched for the external successive access operation which is set by inputting a setting signal ((A) in FIG. 14) or the predetermined command to the predetermined external terminal. During these three periods, the refresh operation is inhibited. However, the count-up signal COUNT is outputted for the three outputs of the refresh-operation-start request signal REQ (I) and thereby the refresh address signal Add (C) is incremented (address #1 to #3). Since the refresh-thinning-out operation and partial refresh operation are set here, the refresh address counter is incremented together with the refresh-operation-start request signal REQ (I).

In this case, since improvement in high speed data transfer ability and I/O bus occupation rate is requested, the refresh operation due to the refresh-operation-start request signal REQ (I) generated during the external successive access operation is executed after the completion of the external successive access operation. However, if the external successive access operation period continues exceeding the three refresh periods, the address of the refresh operation to be executed after the external successive access operation becomes the refresh address #3 which is set by the three times of count-up. For the refresh addresses #1 and #2 before the address #3, the refresh operation is not executed until the timing of the next refresh operation after one refresh cycle. When the external successive access operation is executed in the timing of the next refresh operation, this access operation is extended further, in a certain case, up to the next refresh operation timing. Therefore, here rises a problem that there is a fear that the data may be lost during this period.

FIG. 15 illustrates a second problem. In the case where the high speed data access is required as the system function is further sophisticated, it is also considered that it may be necessary to set with priority the external access operation without influence of the refresh operation.

In FIG. 15, a semiconductor memory device such as a pseudo SRAM or the like is assumed as a device having the function to set the external-access operation priority mode with an input of the setting signal or the predetermined command to the predetermined external terminal. Even when the external-access operation priority mode is set to inhibit the refresh operation, the count-up signal COUNT is outputted for each output of two refresh-operation-start request signals REQ (I) and thereby the refresh address signal Add(C) is incremented (address #1, address #2). The reason is that since the refresh-thinning-out operation and partial refresh operation are set, the refresh address counter is incremented together with the refresh-operation-start request signal REQ (I).

In this case, since the high speed data access performance is requested, the refresh operation due to the refresh-operation-start request signal REQ (I) generated in the external-access operation priority mode period is executed after the setting of the external-access operation priority mode is canceled. However, when the period of the external-access operation priority mode continues exceeding the two refresh periods as explained above, the address of the refresh operation to be executed after the external-access operation priority mode is canceled becomes the refresh address #3 which is set with the subsequent count-up. For the refresh addresses #1, #2 before the address #3, the refresh operation is not executed until the timing of the next refresh operation after one refresh cycle. When the external-access operation priority mode is set in the timing of the next refresh operation, the refresh operation is further delayed in a certain case until the timing of the next refresh operation. Here, a problem also rises here that the data may be lost during this period.

SUMMARY OF THE INVENTION

The present invention has been proposed to overcome the problems of the related arts and it is therefore an object of the present invention to provide a semiconductor memory device and a refresh control method which can execute the refresh operation which may be surely realized without any problem for the external access while realizing a low current dissipation on the occasion of executing the refresh operation as the internal access operation independent of the external access operation.

According to one aspect of the present invention, there is provided a refresh control method of semiconductor memory device comprising an external access operation executed based on an external request and a refresh operation executed internally and automatically, wherein the number of generations of the refresh operation start request is monitored during the period of the external access operation executed with priority to the refresh operation, and the internal operation in the refresh operation is controlled depending on the number of generations of the refresh operation start request.

Moreover, according to one aspect of the present invention, there is also provided a semiconductor memory device executing an external access operation based on an external request and a refresh operation which is conducted therein automatically, comprising: an in-operation-state informing section for informing the in-operation-state of the external access operation and the refresh operation; and a refresh-operation-start request generating section for outputting a refresh-operation-start request signal; and a monitoring section for monitoring, when the in-operation-state informing section is informing the in-operation-state of the external access operation, the number of generations of the refresh-operation-start request signal to control the internal operation in the refresh operation depending on the number of generations of the refresh-operation-start request signal.

In the semiconductor refresh control method and such semiconductor memory device, even when the refresh-operation-start request signal is generated to request the start of the refresh operation during the period of the external access operation to be executed with priority to the refresh operation, the internal operation in the refresh operation is controlled depending on the number of generations of such refresh-operation-start request signal.

Thereby, even during the period of the external access operation which is executed with priority to the refresh operation, the control state of the internal operation required for the refresh operation is held as required and thereby the subsequent refresh operation can surely be executed.

Moreover, according to another aspect of the present invention, there is also provided a refresh control method of semiconductor memory device comprising an external access operation executed based on an external request and a refresh operation executed internally and automatically, wherein the number of generations of the refresh operation start request is monitored during the period in which execution of the refresh operation is inhibited because the external access operation is executed with priority depending on the setting from the external, and the internal operation in the refresh operation is controlled depending on the number of generations of the refresh operation start request.

Moreover, according to another aspect of the present invention, there is also provided a semiconductor memory device executing an external access operation based on an external request and a refresh operation which is conducted therein automatically, comprising: an inhibition-setting informing section for informing the execution-inhibiting-state of the refresh operation based on an external execution-inhibiting setting of the refresh operation; a refresh-operation-start request generating section for outputting a refresh-operation-start request signal; and a monitoring section for monitoring, when the inhibition-setting informing section is informing the execution-inhibiting-state of the refresh operation, the number of generations of the refresh-operation-start request signal to control the internal operation in the refresh operation depending on the number of generations of the refresh-operation-start request signal.

In the semiconductor memory device refresh control method and the semiconductor memory device, even when the refresh-operation-start request signal is generated to request the start of the refresh operation during the period in which execution of the refresh operation is inhibited due to the external setting, the internal operation in the refresh operation is controlled depending on the number of generations of such refresh-operation-start request signal.

Accordingly, the internal operation control state required for the refresh operation can be held as required even during the period in which the refresh operation is inhibited due to the external setting and thereby the subsequent refresh operation can surely be executed.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 14 is a timing chart showing problems during an external access operation.

FIG. 15 is a timing chart showing problems generated when an external-access operation priority mode is set.

DETAILED DESCRIPTION OF THE PREFERRED EMBODIMENTS

The semiconductor memory device refresh control method and the semiconductor memory device including the control method of the present invention will be explained below in detail based on the first and second embodiments thereof with reference to the accompanying drawings.

Figure 1:
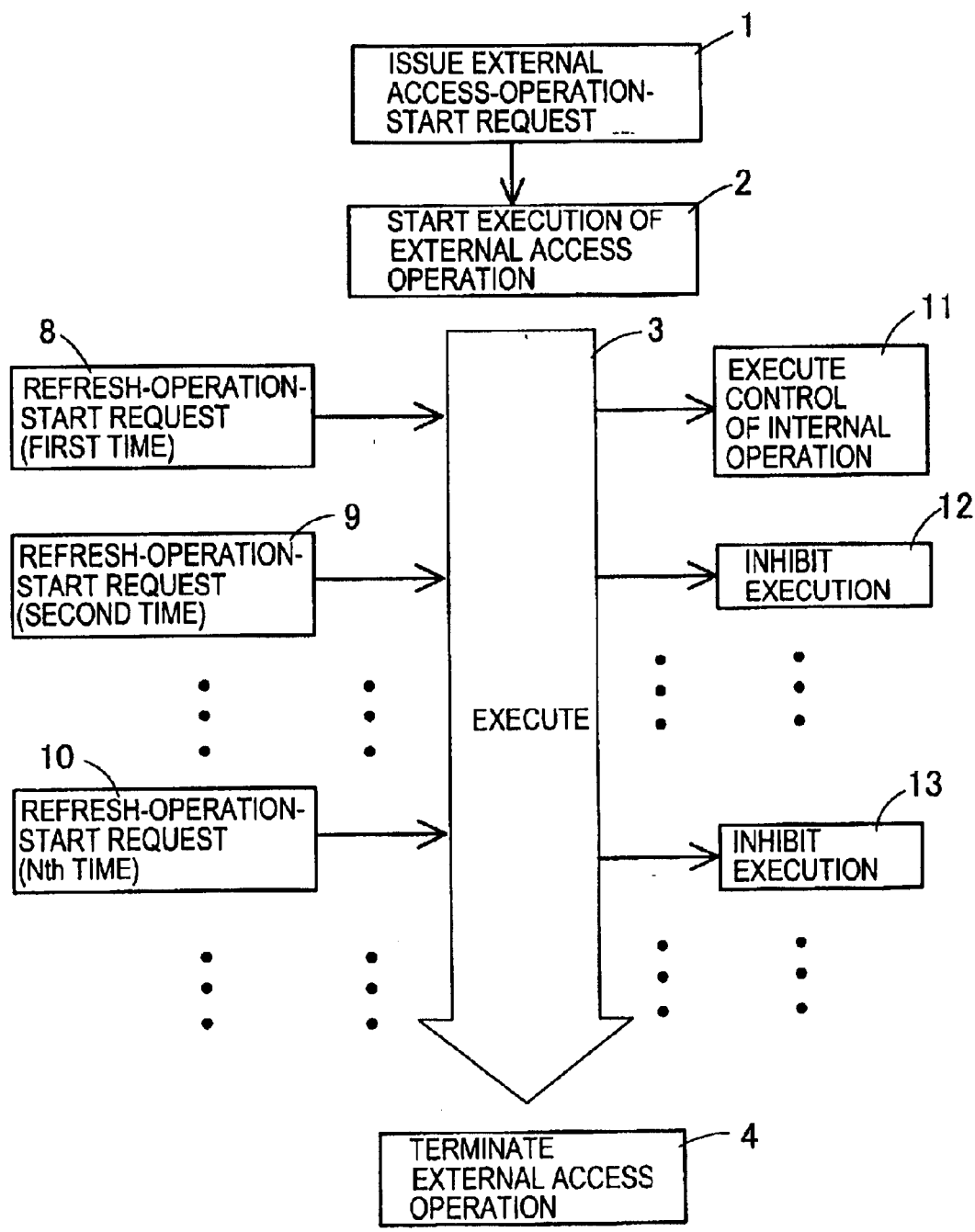
FIG. 1 is a first principle explanatory diagram of the present invention.

FIG. 1 is a first principle explanatory diagram of the present invention. In the first principle explanatory diagram, an external access operation is executed with priority to a refresh operation. When an external access-operation-start request is issued (1) with an input of a setting signal or a command to a control terminal, an execution of the external access operation is started (2). The external access operation means an input and an output of data between the internal side and external side of a semiconductor memory device via the data input/output terminal represented by the data read operation from the semiconductor memory device and data write operation to the semiconductor memory device. Here, such external access operation may include, in addition to the data read and write operations, the refresh operation based on the designation from the external side and the other control commands. Moreover, as the external access operations, those which require the execution time (3) of the predetermined period between the period from the start of execution (2) to the termination of external access operation (4) are also assumed and the typical examples are represented by the continuous access operations such as page operation and burst operation, etc.

Since the external access operation is executed with priority to the refresh operation, execution of the refresh operation is inhibited during the execution period (3) of the external access operation. However, since the internal control in the semiconductor memory device is operating, the internal control outputs the refresh-operation-start request with the predetermined time interval for the refresh operation which is set to be executed for every predetermined time. When the execution period (3) of the external access operation is continued exceeding the predetermined time interval under the internal control, the refresh-operation-start requests (8) to (10) are outputted for every predetermined time. For the first refresh-operation-start request (8) outputted during execution (3) of external access operation, the internal operation in the refresh operation is controlled (11) but for the second and subsequent refresh-operation-start requests (9) (10), execution of the internal operation in the refresh operation is inhibited (12), (13). Therefore, even if the refresh-operation-start requests (8) to (10) outputted with the internal control of the semiconductor memory device are outputted previously during the period wherein the external access operation is executed (3) and execution of the refresh operation is inhibited, only the internal operation in the refresh operation is never conducted previously and the refresh operation is surely executed after the end (4) of the external access operation.

Figure 2:
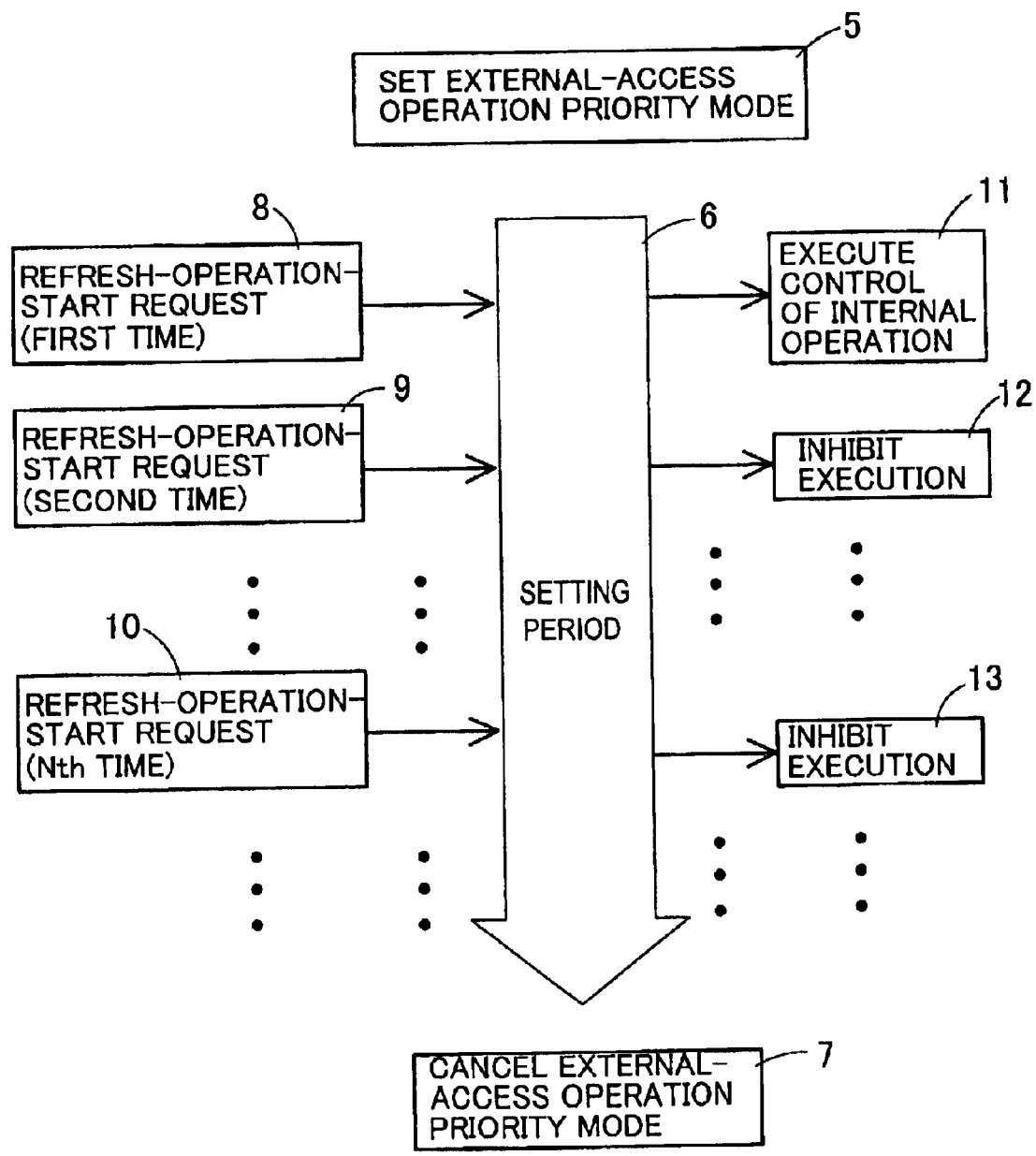
FIG. 2 is a second principle explanatory diagram of the present invention.

FIG. 2 is the second principle explanatory diagram of the present invention. In this second principle explanatory diagram, the external-access operation priority mode is set. When the external-access operation priority mode is set (5) with an input of the setting signal or command to the control terminal, the refresh operation as the internal access operation is inhibited during the setting period (6) until the external-access operation priority mode is canceled (7) with an input of a cancellation signal or command to the control terminal. In view of always providing the operation performance of the highest priority to the external access operation which is externally inputted as required during this setting period (6), the refresh operation which is executed independently to the external access operation is inhibited to eliminate the interference between the external access operation and refresh operation and an adjusting time such as arbitration among the operations.

During the period (6) where the external-access operation priority mode is set, execution of the refresh operation is inhibited as in the case of the period (3) where the external access operation in the first principle explanatory diagram is executed. However, since the internal control in the semiconductor memory device is effective also in this case, the internal control issues a refresh-operation-start request in the predetermined time interval for the refresh operation which is set to be executed for every predetermined time. Therefore, when the period of the external-access operation priority mode (6) continues exceeding the predetermined time interval for the internal control, the internal operation in the refresh operation is controlled for the first refresh-operation-start request (8) and the internal operation in the refresh operation is inhibited for the second and subsequent refresh-operation-start requests (9) and (10). Thereby, even when the refresh-operation-start requests (8) to (10) which are outputted by the internal control are previously outputted for several times while the external-access operation priority mode in which execution of the refresh operation is inhibited is set (6), only the internal operation in the refresh operation is not executed previously and thereby the refresh operation after the cancellation of the external-access operation priority mode (7) can surely be executed.

Figure 3:
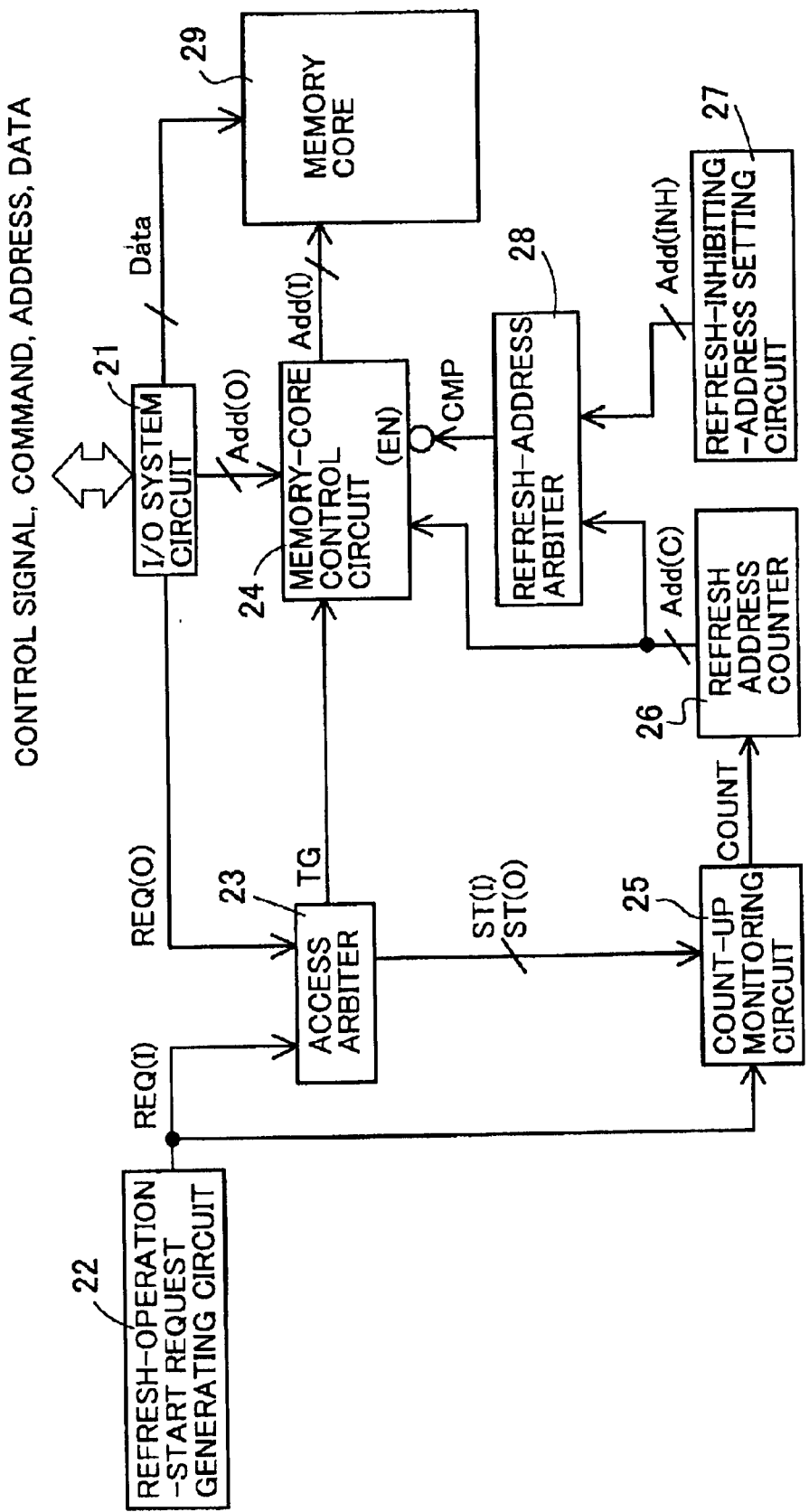
FIG. 3 is a circuit block diagram of a first embodiment of the present invention.

The first embodiment shown in FIG. 3 corresponds to the first principle explanatory diagram of FIG. 1, illustrating a circuit block structural diagram in regard to the refresh control method in which an external access operation preferential to a refresh operation is executed.

Various signals such as control signals, various commands, addresses and data or the like inputted to or outputted from a semiconductor memory device are inputted to or outputted from an I/O system circuit 21 within the semiconductor memory device via control terminals or command input terminals, address terminals and data input/output terminals or the like. In the I/O system circuit 21, various input signals are outputted to each internal control circuits after the decoding as required through detection of signal level and waveform shaping or the like via the input buffers. Moreover, output signals such as readout data are outputted to an external circuit from output terminals through the output buffers or the like.

With an input of the single predetermined control signal or command among the control signals and commands inputted from the control terminal or command input terminal or with combination of the inputs of a plurality of predetermined control signals or commands, the external-access-start request signal REQ (O) is generated and is then outputted to an access arbiter 23.

Meanwhile, the refresh-operation-start request signal REQ (I) is outputted in every predetermined period from the refresh-operation-start request generating circuit 22 for the refresh operation as the internal access operation in which the semiconductor memory device itself controls execution of the operation in every predetermined period and this signal REQ (1) is inputted to the access arbiter 23 and is then inputted to a count-up monitoring circuit 25.

The access arbiter 23 executes arbitration such as execution timing and execution priority sequence of the external access operation and refresh operation. The access arbiter 23 is, for example, an arbitration circuit which arbitrates the timing for determining the operation to be executed with priority and for delaying the operation when the external-access-start request signal REQ (O) and refresh-operation-start request signal REQ (I) are inputted simultaneously or in the overlapped manner. A result of arbitration is outputted as an access trigger signal TG to a memory-core control circuit 24. Moreover, the external-access-state signal ST (O) or a refresh-state signal ST (I) which indicate that the external access operation or refresh operation is in the executable state is outputted to the count-up monitoring circuit 25.

The refresh-operation-start request signal REQ (I) is inputted to the count-up monitoring circuit 25 together with the external-access-state signal ST (O) or refresh-state signal ST (I) and this refresh-operation-start request signal REQ (I), and the count-up monitoring circuit 25 outputs the count-up signal COUNT for controlling count-up operation of the refresh address counter 26 in response to the refresh-operation-start request signal REQ(I) depending on the access operation state by the external-access-state signal ST (O) or refresh-state signal ST (I). Namely, under the condition that the external access operation is executed and the external-access-state signal ST (O) is set, the count-up signal COUNT is controlled not to be outputted for the second and subsequent refresh-operation-start request signal REQ (I).

The refresh address counter 26 sequentially counts up by receiving the count-up signal COUNT and outputs the refresh address signal Add (C) to be refreshed. Moreover, a refresh-inhibiting-address setting circuit 27 previously sets the addresses for which the refresh operation is not executed at the time of so-called the refresh-thinning-out operation and partial refresh operation. This circuit can introduce the structure to previously store the address to a non-programmable storage means such as a fuse element and a non-volatile memory (ROM) or the like and to store the address when it is requested to a rewritable storage means such as a flash memory and volatile memory (RAM) or the like. In addition, it is also possible to structure a storage means such as a register which can hold information. The refresh address signal Add (C) outputted from the refresh address counter 26 and the refresh-inhibiting-address signal Add (INH) outputted from the refresh-inhibiting-address setting circuit 27 are inputted to a refresh-address arbiter 28. Moreover, the refresh-address signal Add (C) is inputted to the memory-core control circuit 24.

The refresh-address arbiter 28 compares the refresh address signal Add (C) with the refresh-inhibiting-address signal Add (INH) for the judgment. When the partial refresh operation is set, if the both address signals compared are matched, a comparison signal CMP is outputted to the memory-core control circuit 24 and when the refresh-thinning-out operation is set, if the both address signals compared are matched, and if the data holding time from the preceding refresh operation for the preset refresh address signal Add (C) is shorter than the predetermined time, a comparison signal CMP is outputted to the memory-core control circuit 24.

To the memory-core control circuit 24, the address signal Add (O) during the external access operation is inputted from the I/O system circuit 21, and the refresh address signal Add (C) together with the comparison signal CMP is inputted also. Moreover, the internal address signal Add (I) is supplied to the memory core 29 together with the control signal CNT (not shown) by receiving the access trigger signal TG from the access arbiter 23. Using these signals, the data input/output are executed between the memory core 29 and I/O system circuit 21.

In the case where the external access operation is not executed and the external-access-start request signal REQ (O) is not outputted from the I/O system circuit 21, when the refresh-operation-start request signal REQ (I) is inputted to the access arbiter 23 from the refresh-operation-start request generating circuit 22, the refresh operation is executed with the arbitrating function. Namely, the refresh-state signal ST (I) is set and the access trigger signal TG for the refresh operation is inputted to the memory-core control circuit 24. Moreover, the refresh-operation-start request signal REQ (I) is inputted to the count-up monitoring circuit 25 together with the refresh-state signal ST (I). The count-up monitoring circuit 25 outputs the count-up signal COUNT to count up the refresh address counter 26 in view of updating the refresh address signal Add (C).

In the memory-core control circuit 24, the refresh address signal Add (C) from the refresh address counter 26 is set as the internal address signal Add (I) based on the access trigger signal TG for the refresh operation. The memory core 29 is controlled with the control signal CNT. Thereby, the refresh operation is controlled.

In the case where an external access operation is generated and an external-access-start request signal REQ (O) is generated in the I/O system circuit 21, when the external-access-start request signal REQ (O) is inputted to the access arbiter 23, the external access operation is executed preferentially with the arbitrating function. Namely, the refresh-state signal ST (I) is not set and only the external-access-state signal ST (O) is set without relation to the refresh-operation-start request signal REQ (I) from the refresh-operation-start request generating circuit 22 and the access trigger signal TG for the external access operation is inputted to the memory-core control circuit 24.

In the memory-core control circuit 24, the address signal Add (O) for external access operation from the I/O system circuit 21 is set as the internal address signal Add (I) based on the access trigger signal TG for the external access operation. The memory core 29 is controlled with a control signal CNT. Thereby, the data input/output control for the external circuit is executed via the I/O system circuit 21.

On the other hand, the preset external-access-state signal ST (O) is inputted to the count-up monitoring circuit 25 to execute the count-up control of the refresh address counter 26. In the case where execution of external access operation is given the priority with the access arbiter 23, although the setting is made so that the memory-core control circuit 24 is controlled with the access trigger signal TG and only the external access operation is executed, the refresh-operation-start request generating circuit 22 which is not controlled from the access arbiter 23 and memory-core control circuit 24 outputs in every predetermined period the refresh-operation-start request signal REQ (I). This refresh-operation-start request signal REQ (I) is inputted to the access arbiter 23 and is also inputted to the count-up monitoring circuit 25.

In this case, since the external-access-start request signal REQ (O) is inputted to the access arbiter 23, the access trigger signal TG is not outputted for the refresh operation-start request signal REQ (I). Moreover, under the condition that the external-access-state signal ST (O) is set as the input in the count-up monitoring circuit 25, the count-up signal COUNT is outputted only for the first refresh operation-start request signal REQ (I), but the count-up signal COUNT is never outputted for the second and subsequent refresh-operation-start request signals REQ (I). Accordingly, the necessary refresh address signal Add (C) is maintained with the access trigger signal TG for the refresh operation outputted from the access arbiter 23 in the refresh address counter 26 before the refresh-operation-start request signal REQ (I) is set after the external access operation completed and the external-access-start request signal REQ (O) is reset.

Here, when the refresh-operation-start request signal REQ (I) is set in the timing that the external-access-start request signal REQ (O) is reset after completion of the external access operation, it is also considered that the count-up signal COUNT from the count-up monitoring circuit 25 is outputted. In this case, it is possible to execute the control so that the refresh operations of continuous two cycles are executed by sequentially switching the refresh address signal Add (C) with the access trigger signal TG for the refresh operation from the access arbiter 23, while conducting the control such as the arbitration of the output timing of the count-up signal COUNT with a counter control circuit or the like not illustrated.

In the semiconductor memory device having the function of the refresh-thinning-out operation or partial refresh operation or the like in order to reduce a current dissipation during the refresh operation, the refresh address signal Add (C) outputted from the refresh address counter 26 is compared, in the stage that the refresh operation is executed, for judgment whether it is matched with the refresh-inhibiting-address signal Add (INH) for which the refresh operation is inhibited. In the case where the refresh-thinning-out operation is provided, judgment whether the refresh-thinning-out operation should be executed or not is executed depending on the data holding characteristic for the output refresh address signal Add (C). When the result of judgment that the refresh operation should be inhibited is attained, the control of the memory-core control circuit 24 is inhibited and thereby an output to the control signal CNT to the memory core 29 is inhibited. When the result that the refresh operation should be executed is obtained, the comparison signal CMP of the low logic level is outputted and the control signal CNT to the memory core 29 is outputted under the control of the memory-core control circuit 24 and thereby the refresh operation is executed.

Figure 4:
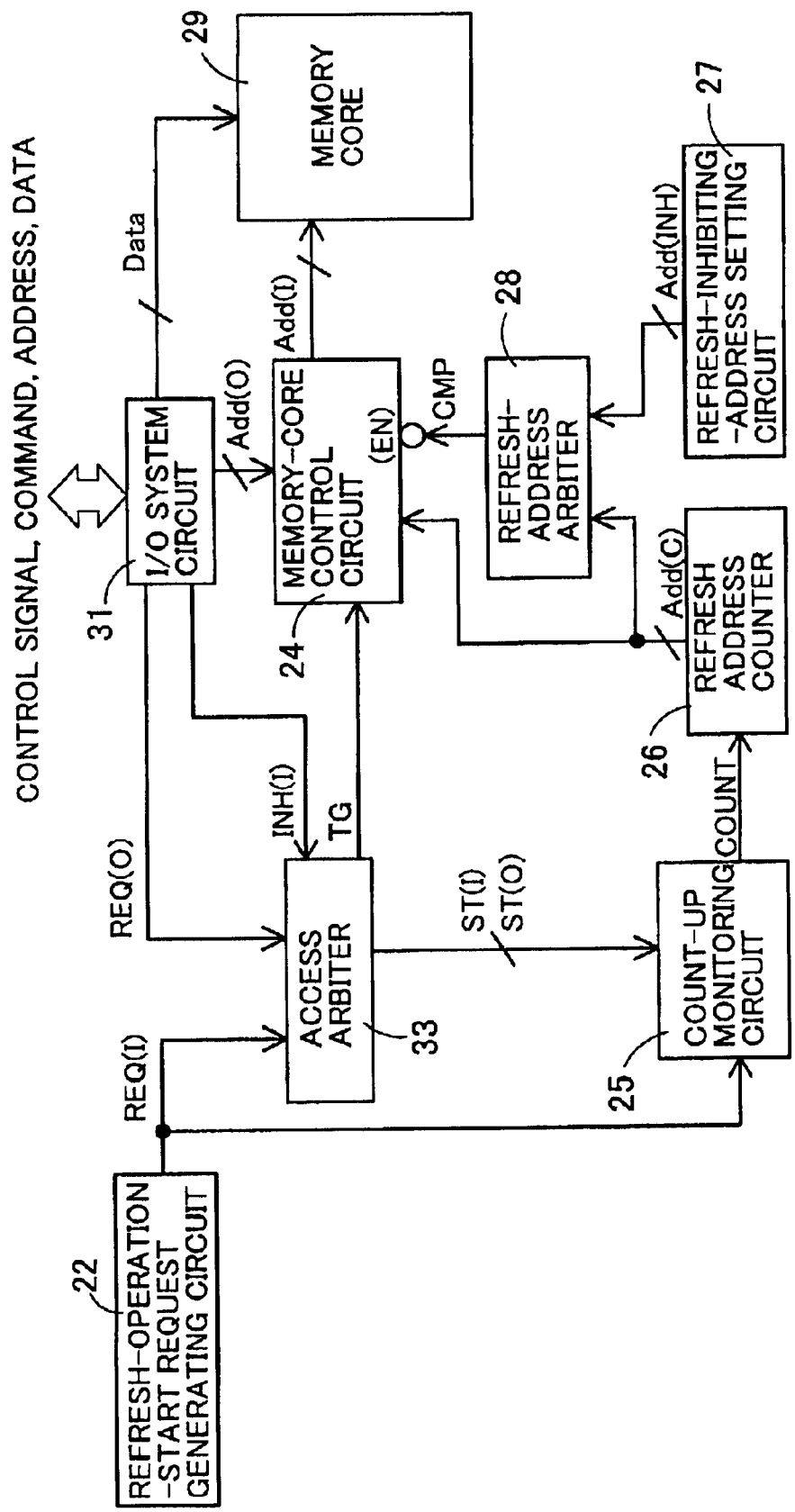
FIG. 4 is a circuit block diagram of a second embodiment of the present invention.

FIG. 4 shows a second embodiment corresponding to the second principle explanatory diagram of FIG. 2, which is a circuit block structural diagram in regard to the refresh control method in which the external-access operation priority mode is set. In the second embodiment, an I/O system circuit 31 and an access arbiter 33 are provided in place of the I/O system circuit 21 and the access arbiter 23 of the first embodiment and an refresh-operation-execution inhibiting signal INH (I) is outputted to the access arbiter 33 from the I/O system circuit 31.

The external-access operation priority mode is set with an input of the single predetermined control signal or command or with a combination of the input of a plurality of predetermined control signals or commands. When the external-access operation priority mode is set, the refresh-operation-execution inhibiting signal INH (I) is outputted from the I/O system circuit 31 and the external-access-start request signal REQ (O) is inputted to the access arbiter 33 without relation to the external access operation to set the access arbiter 33 to the condition in which the refresh operation is inhibited.

Namely, the access arbiter 33 does not set the refresh-state signal ST (I) but the external-access-state signal ST (O) and the count-up signal COUNT is outputted only to the first refresh-operation-start request signal REQ (I) but the count-up signal COUNT is never outputted for the second and subsequent refresh-operation-start request signal REQ (I) as in the case of the execution of the external access operation in the first embodiment. The access trigger signal TG is outputted only to the external-access-start request signal REQ (O) and therefore the high speed external access operation can be executed.

The circuit blocks designated with the same reference numbers as the circuit blocks in the first embodiment have the same functions and the same explanation is not repeated here.

Figure 5:
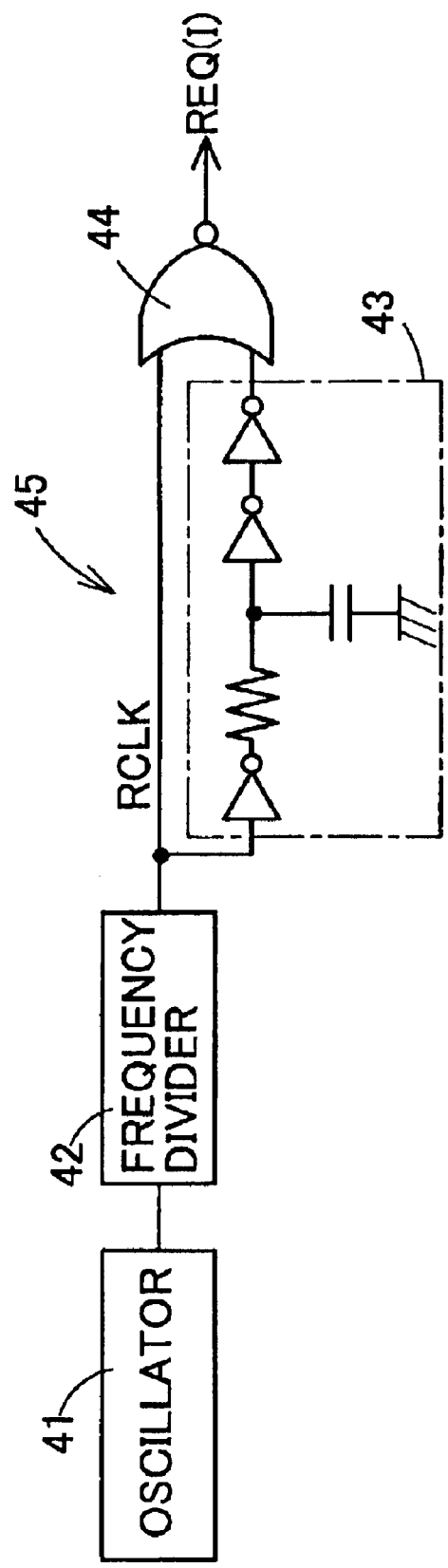
FIG. 5 is a circuit block diagram showing a practical example of a refresh-operation-start request generating circuit.

In the circuit diagram showing a practical circuit example of the refresh-operation-start request generating circuit of FIG. 5, the refresh-operation-start request signal REQ (I) is outputted in every predetermined time interval as the pulse signal of high logic level. In the semiconductor memory device, it is required that the refresh-operation-start request signal REQ (I) must be outputted in every refresh period depending on the data holding characteristic of the memory cell.

An oscillation frequency output of an oscillator 41 formed of a ring oscillator or the like is divided with a frequency divider 42 and an oscillation-frequency-divided signal RCLK having the predetermined period equal to the refresh period is outputted from the frequency divider 42. This oscillation-frequency-divided signal RCLK is inputted in direct to one input terminal of a NOR logic gate 44 and is then inputted to a delay unit 43 formed of a set of the CR delay circuit composed of a resistance element and a capacitance element which are connected in series to the three-staged inverter logic gate and the three-staged inverter logic. A pulse generating circuit 45 is formed of the delay unit 43 and the NOR logic gate 44 and outputs the pulse signal of high logic level having the time duration of the delay time which is set in the delay unit 43 from the falling edge of the oscillation-frequency-divided signal RCLK. This pulse signal is outputted as the refresh-operation-start request signal REQ (I).

Here, the number of inverter logic gates connected to form the delay unit 43 is not restricted to three stages when the odd number logic gates are connected and two or more sets of the CR delay circuits may be provided or this CR delay circuit may be less than two sets thereof. In the structure that an output signal of the delay unit 43 is a logically inverted delay signal, the number of connections of inverters of odd number and the number of connections of the CR delay circuit may be selected freely. Moreover, it is also possible to introduce the structure other than the inverter logic gate and CR delay circuit.

Figure 6:
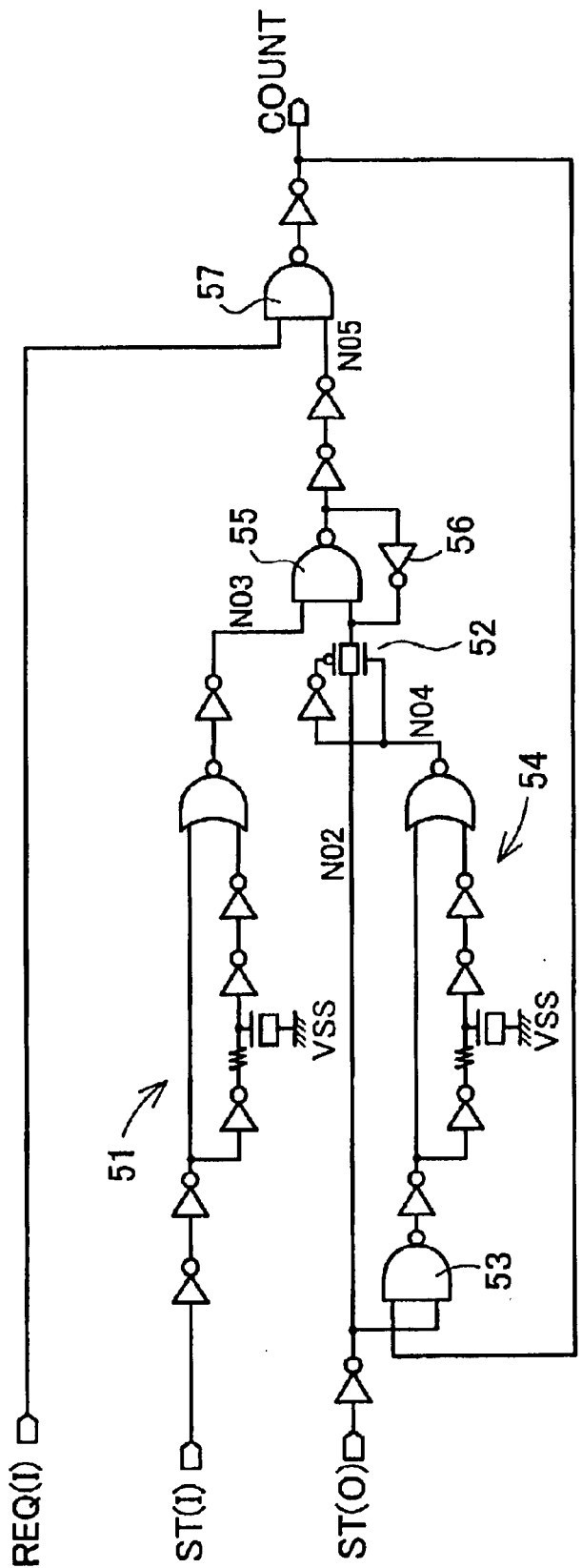
FIG. 6 is a circuit diagram showing a practical example of a count-up monitoring circuit.

In the circuit diagram showing a practical example of the count-up monitoring circuit of FIG. 6, output of the count-up signal COUNT to the refresh-operation-start request signal REQ (I) is controlled depending on the set state of the external-access-state signal ST (O) and refresh-state signal ST (I). In the practical example of FIG. 6, the external-access-state signal ST (O) is outputted from the access arbiter 23 by the external-access-start request signal REQ (O) due to generation of the external access operation and is the practical example in the first embodiment. Moreover, when the external-access-state signal ST (O) is assumed as the signal outputted from the access arbiter 33 by the refresh-operation-execution inhibiting signal INH (I) due to the setting of the external-access operation priority mode, this signal may also be adapted as the practical example of the second embodiment. In the following explanation, an example of the first embodiment is assumed for the convenience of explanation. Following explanation can be of course applied to the second embodiment when the access arbiter 23 is replaced with the access arbiter 33 and moreover the description "output of the external-access-state signal ST (O) is controlled with the external-access-start request signal REQ (O)" is replaced with the description "output of the external-access-state signal ST (O) is controlled with the refresh-operation-execution inhibiting signal INH (I).

The refresh-state signal ST (I) is inputted to the pulse generating circuit 51 having the structure same as that of the pulse generating circuit 45 (refer to FIG. 5) via the two-staged inverter logic gate. An output terminal of the pulse generating circuit 51 is connected to one input terminal of a NAND logic gate 55 as the terminal N03 via the inverter logic gate. Therefore, the pulse signal of high logic level outputted from the pulse generating circuit 51 is transferred as the pulse signal of low logic level to the terminal N03 and is then inputted to one input terminal of the NAND logic gate 55.

The external-access-state signal ST (O) is transferred as an inverted signal to the terminal N02 via the inverter logic gate and is also inputted to a transfer gate 52 and a NAND logic gate 53. The transfer gate 52 is also connected to the other input terminal of the NAND logic gate 55. Moreover, an output terminal of the NAND logic gate 53 is connected to a pulse generating circuit 54 of the same structure as the pulse generating circuit 45 (refer to FIG. 5) via the inverter logic gate. An output terminal of the pulse generating circuit 54 is connected in direct as the terminal N04 to the gate terminal of the NMOS transistor of the transfer gate 52 and also to the gate terminal of the PMOS transistor via the inverter logic gate. The transfer gate 52 is controlled to the ON and OFF states with a pulse signal of the high logic level from the pulse generating circuit 54.

The NAND logic gate 55 forms a latch circuit in combination with the inverter logic gate 56 of which output signal is fed back to the input terminal connected to the transfer gate 52. An output terminal of the NAND logic gate 55 which is an output terminal of the latch circuit is connected to the one input terminal of the NAND logic gate 57 as a terminal N05 via two-staged inverter logic gates. The other input terminal of the NAND logic gate 57 receives the refresh-operation-start request signal REQ (I). An output of the count-up signal COUNT is controlled from the NAND logic gate 57 via the inverter logic gate.

Next, the output control of the count-up signal COUNT will be explained based on the timing chart of FIG. 7. The refresh-operation-start request generating circuit of FIG. 5 generates, in every predetermined time interval, the refresh-operation-start request signal REQ (I) as the pulse signal of high logic level from the falling edge of the oscillation-frequency-divided signal RCLK. A NAND logic gate 57 of FIG. 6 to which the refresh-operation-start request signal REQ (I) is inputted is controlled with the external-access-state signal ST (O) which is set by the low logic level and the refresh-state signal ST (I) which is set by the high logic level to execute the output control of the count-up signal COUNT.

Under the condition that the external access operation and refresh operation are not executed, the external-access-state signal ST (O) is set to the high logic signal, while the refresh-state signal ST (I) is set to the low logic signal. Under this condition, the terminal N02 is in the low logic level, the terminal N03 is in the high logic level and the terminal N04 is in the low logic level. Therefore, the transfer gate 52 is maintained in the OFF state to cut off the signal transfer from the terminal N02 and the NAND logic gate 55 becomes the logical inverted gate of which input terminal is connected to the output terminal of the inverter logic gate 56 in order to maintain the latch condition of the output signal in combination with the inverter logic gate 56. In more practical, the NAND logic gate 55 and the inverter logic gate 56 constitute a latch circuit to latch a record that the terminal N03 has been set in low logic pulse by the previous refresh-operation-start request signal REQ (I) and the terminal N05 is, as a result, in the high logic level.

Figure 7:
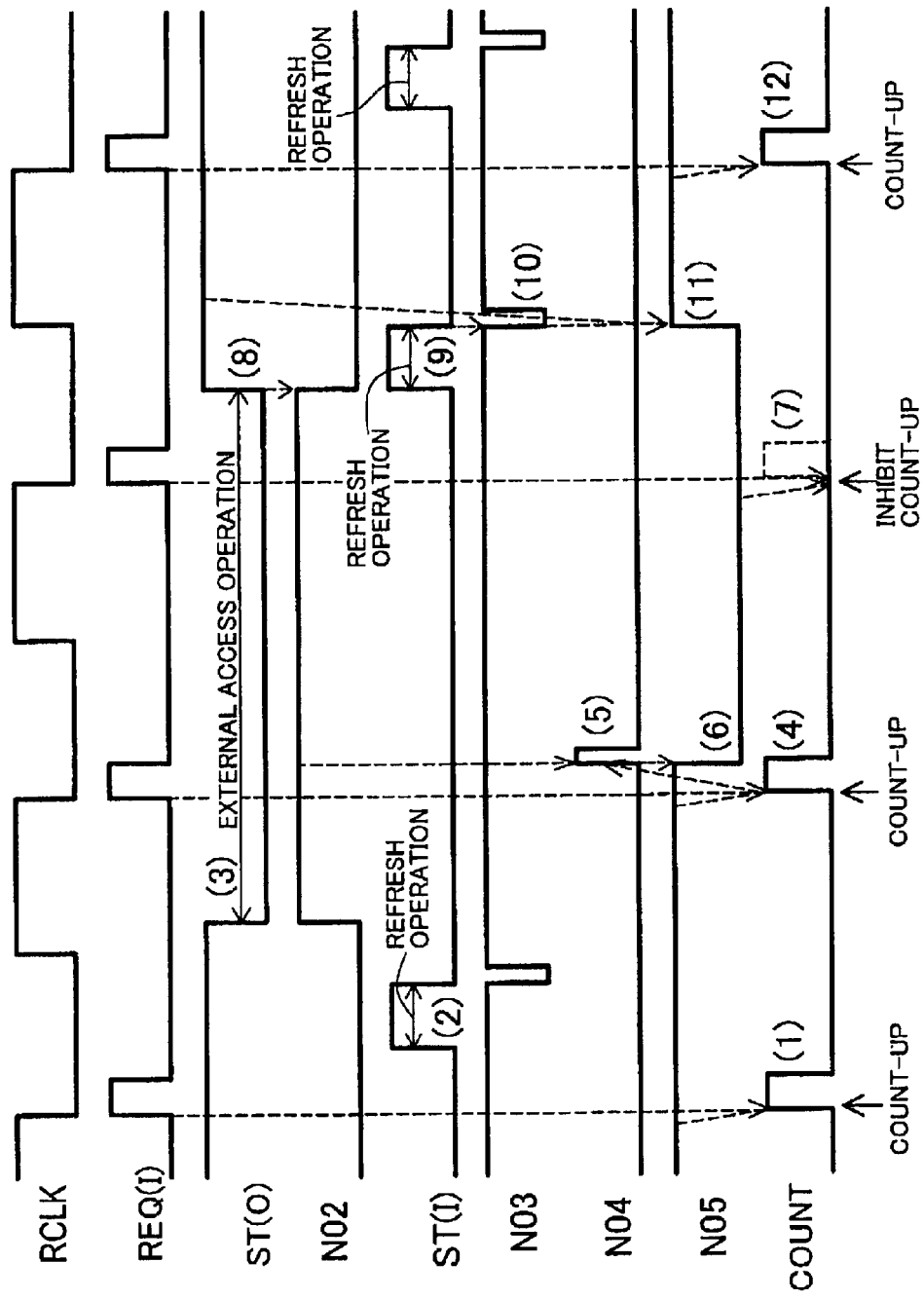
FIG. 7 is a timing chart showing circuit operations of the practical example.

Since the NAND logic gate 57 is functioning, under this condition, as the logic inverted gate, when the refresh-operation-start request signal REQ (I) of high logic pulse is inputted, the count-up signal COUNT of the high logic level is outputted ((1) in FIG. 7). Thereby, the refresh address counter 26 is counted up. In this case, the count-up signal COUNT of the high logic level is fed back to the NAND logic gate 53 but since the terminal N02 maintains the low logic level, the output terminal of the NAND logic gate 53 is maintained at the high logic level and the OFF state of the transfer gate 52 is also maintained. Thereafter, the access trigger signal TG for the refresh operation is outputted by the access arbiter 23 and the refresh-state signal ST (I) of the high logic level is also outputted ((2) of FIG. 7). A low logic pulse signal is outputted to the terminal N03 at the falling edge of the refresh-state signal ST (I) but the operating condition of circuit is never transitioned.

Next, when the external-access-start request signal REQ (O) of the low logic level is outputted, the terminal N02 is inverted to the high logic level and the count-up monitoring circuit transitions to the external access operation executing state (in the second embodiment, during the setting of the external-access operation priority mode) ((3) of FIG. 7) An output condition of the refresh-operation-start request REQ (I) during such transition will be explained. Since the transfer gate 52 is in the OFF state for the first refresh-operation-start request signal ERQ (I), the terminal N05 maintains the high logic level. Therefore, the count-up signal COUNT is outputted as the high logic pulse signal like the ordinary count-up signal ((4) of FIG. 7).

In this case, the count-up signal COUNT of the high logic level is fed back to the NAND logic gate 53 and an output terminal of the NAND logic gate 53 is inverted with the terminal N02 of the high logic level. The pulse signal of the high logic level is outputted to the terminal N04 by the inverter logic gate and pulse generating circuit 54 ((5) of FIG. 7). Therefore, the transfer gate 52 is turned ON to invert the latch circuit composed of the NAND logic gate 55 and inverter logic gate 56. As a result, the signal level of the terminal N05 is inverted to the low logic level ((6) of FIG. 7). Since the one input terminal of the NAND logic gate 57 is latched to the low logic terminal, the count-up signal COUNT is fixed to the low logic level.

Therefore, even when the second and subsequent refresh-operation-start request signal REQ (I) is inputted and the pulse of the high logic level is inputted to the other input terminal of the NAND logic gate 57, the count-up signal COUNT of the high logic level is never outputted ((7) of FIG. 7). This condition is lasted until the external-access-state signal ST (O) of the low logic level is completed ((8) of FIG. 7), the refresh-state signal ST (I) of the high logic level is outputted and the latch signal of the latch circuit is inverted with the falling edge of the refresh-state signal ST (I) ((9) to (11) of FIG. 7). The refresh-state signal ST (I) is outputted when the refresh operation which has been stopped by the access arbiter 23 while the external-access-state signal ST (O) is outputted is executed after the completion of the external-access-state signal ST (O). Moreover, when the refresh operation request is not inhibited while the external-access-state signal ST (O) is being outputted, the refresh-state signal ST (I) is also outputted due to the refresh-operation-start request signal REQ (I) which is newly outputted after the completion of the external-access-state signal ST (O).

In FIG. 7, the refresh operation is inhibited, although the refresh-operation-start request signal REQ (I) is outputted while the external-access-state signal ST (O) is outputted. After completion of the external-access-state signal ST (O) ((8) in FIG. 7), the refresh operation is executed when the access trigger signal TG is outputted by the access arbiter 23 for the refresh operation. Simultaneously, the refresh-state signal ST (I) is also outputted ((9) of FIG. 7). A latch signal of the latch circuit is inverted with the pulse signal of the low logic level ((10) of FIG. 7) outputted to the terminal N03 at the falling edge of the refresh-state signal ST (I) and thereby the logic level of the terminal N05 is inverted to the high logic level, ((11) of FIG. 7). Thereby, the NAND logic gate 57 can accept the refresh-operation-start request signal REQ (I) and the count-up signal COUNT can also be outputted ((12) of FIG. 7).

Figure 8:
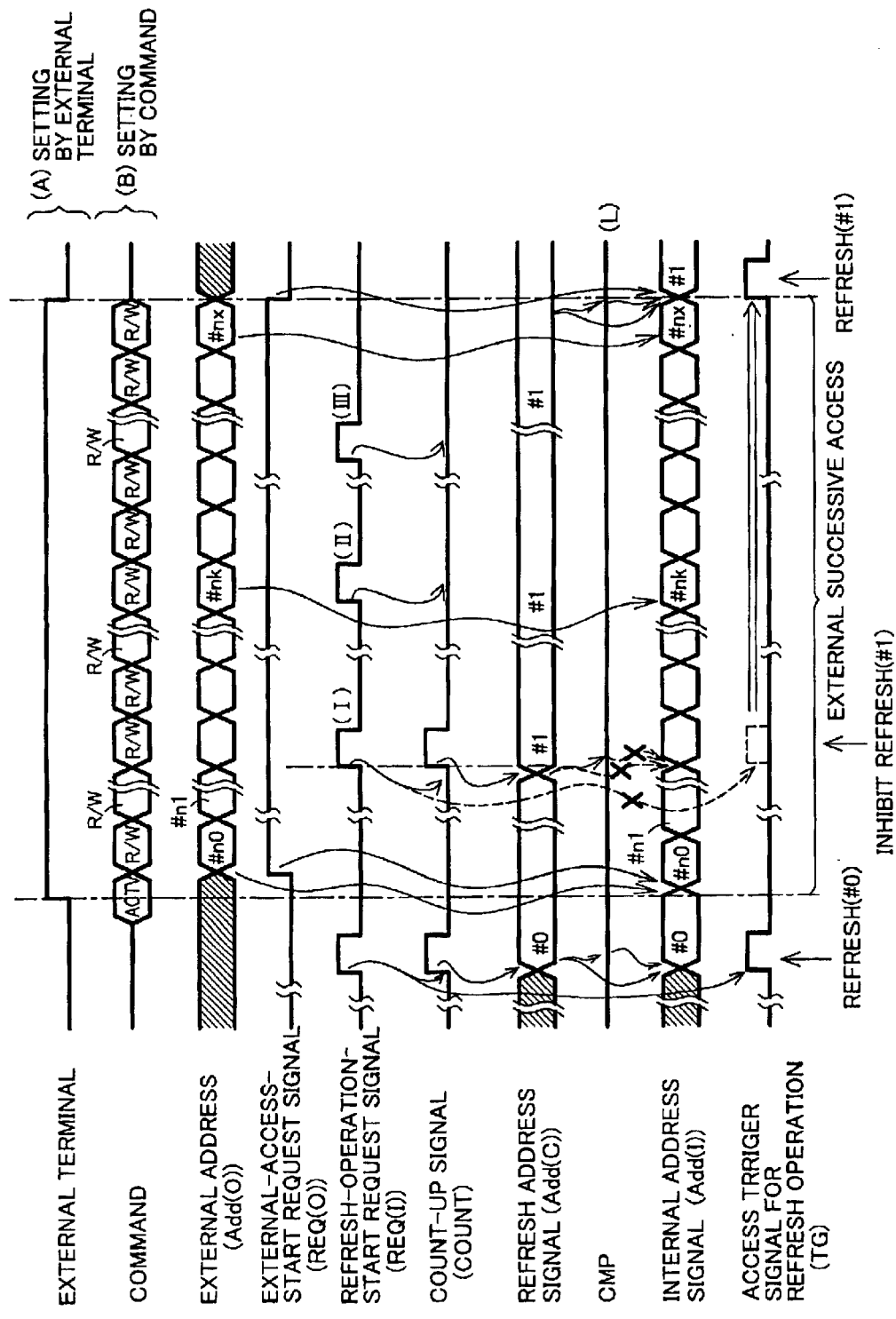
FIG. 8 is a timing chart showing operations of the first embodiment.

Next, the operation timing chart of this embodiment is shown. FIG. 8 is the operation timing chart of the first embodiment in which the refresh operation is controlled during the external successive access operation. In FIG. 8, the operation timing chart under the same conditions of FIG. 14 for the first problem of the related art is illustrated.

During the external successive access operation by the input of a setting signal ((A) of FIG. 8) or the predetermined command ((B) of FIG. 8) to the predetermined external terminal, the refresh-operation-start request signal REQ (I) is outputted for three times ((I) to (III)). Since the count-up signal COUNT of the high logic level is outputted for the first refresh-operation-start request signal REQ (I) ((I) of FIG. 8), the refresh address counter 26 executes the count-up operation and the refresh address signal Add (C) is incremented to #1 from #0. However, since the external successive access operation is being executed, the access control of the access arbiter 23 is set to the external access and thereby the access trigger signal TG is outputted for the external access operation. Accordingly, the refresh operation is not executed. As a result, the refresh operation for the refresh address #1 is inhibited.

Moreover, since the external-access-state signal ST (O) is inputted to the count-up monitoring circuit 25 from the access arbiter 23, output of the count-up signal COUNT is controlled for the second and third refresh-operation-start request signal REQ (I) ((II), (III) of FIG. 8). Therefore, the refresh address counter 26 does not execute the count-up operation and the refresh address signal Add (C) is maintained at the address #1. This condition is also maintained for the fourth and subsequent refresh-operation-start request signal REQ (I) and the refresh address signal Add (C) is maintained at the address #1 during the period of the external successive access operation.

The refresh operation for the refresh address #1 which has been inhibited during the external successive access operation is executed upon completion of the external successive access operation. In more practical, such refresh operation is executed when the access arbiter 23 which has detected completion of the external-access-start request signal REQ (O) outputs the access trigger signal TG for the refresh operation. In this case, the refresh address signal Add (C) has the address #1 which is set by the first refresh-operation-start request signal REQ (I) during the external successive access operation and the refresh operation which has been inhibited during the external successive access operation is executed upon completion of the external successive access operation.

Figure 9:
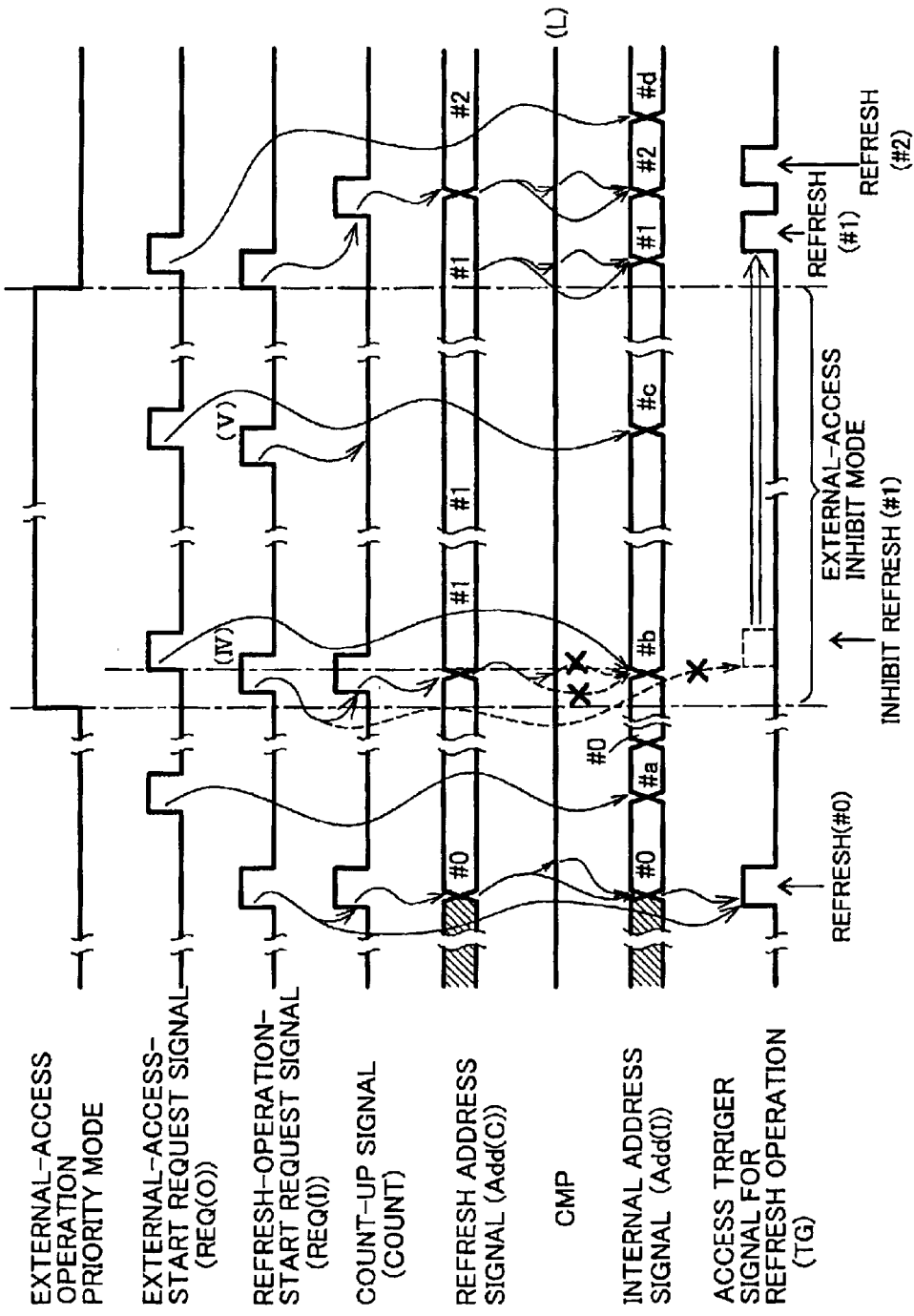
FIG. 9 is a timing chart showing operations of the second embodiment.
Figure 10:
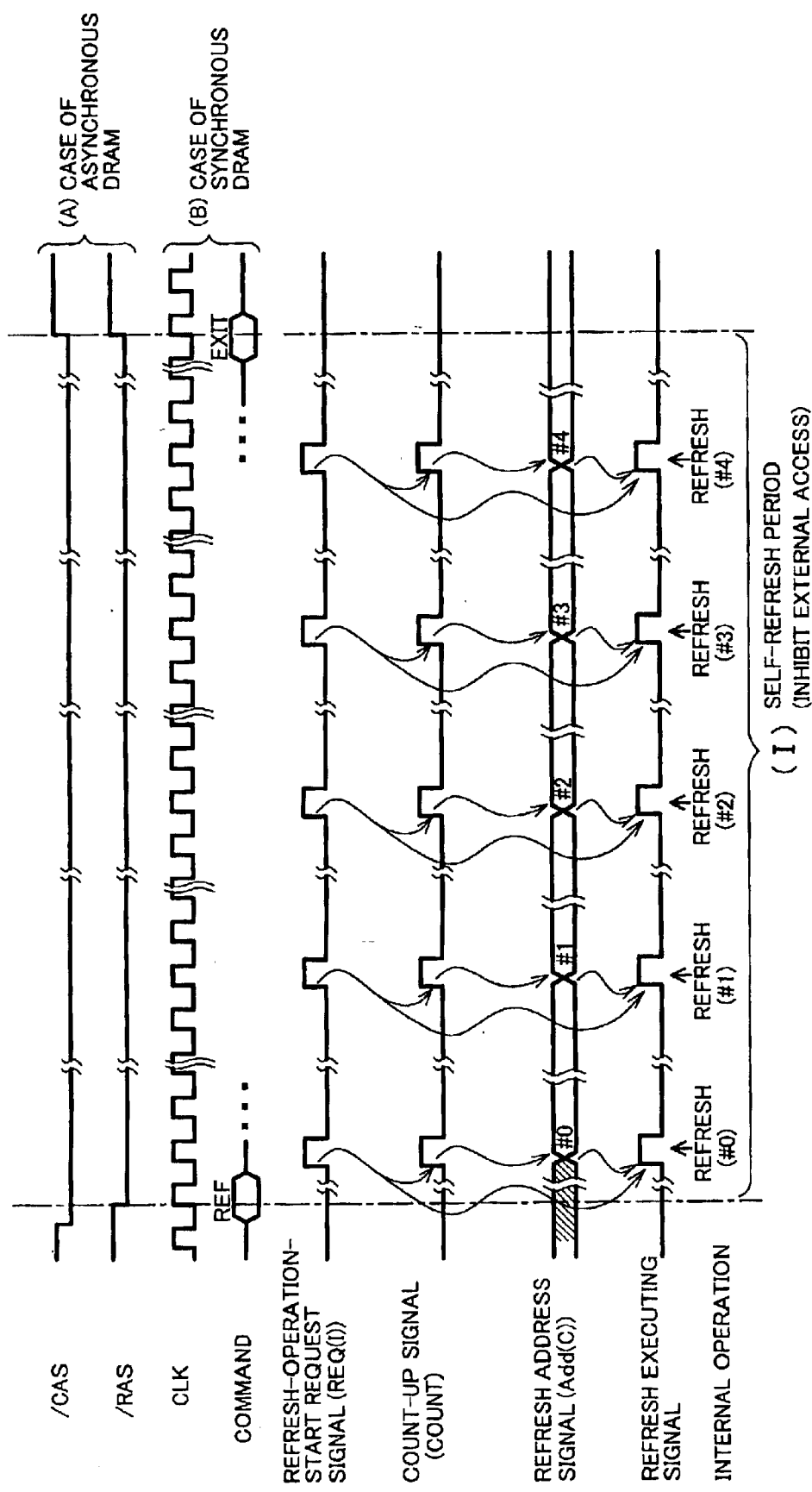
FIG. 10 is a timing chart showing the refresh operation (1) of the related art.
Figure 11:
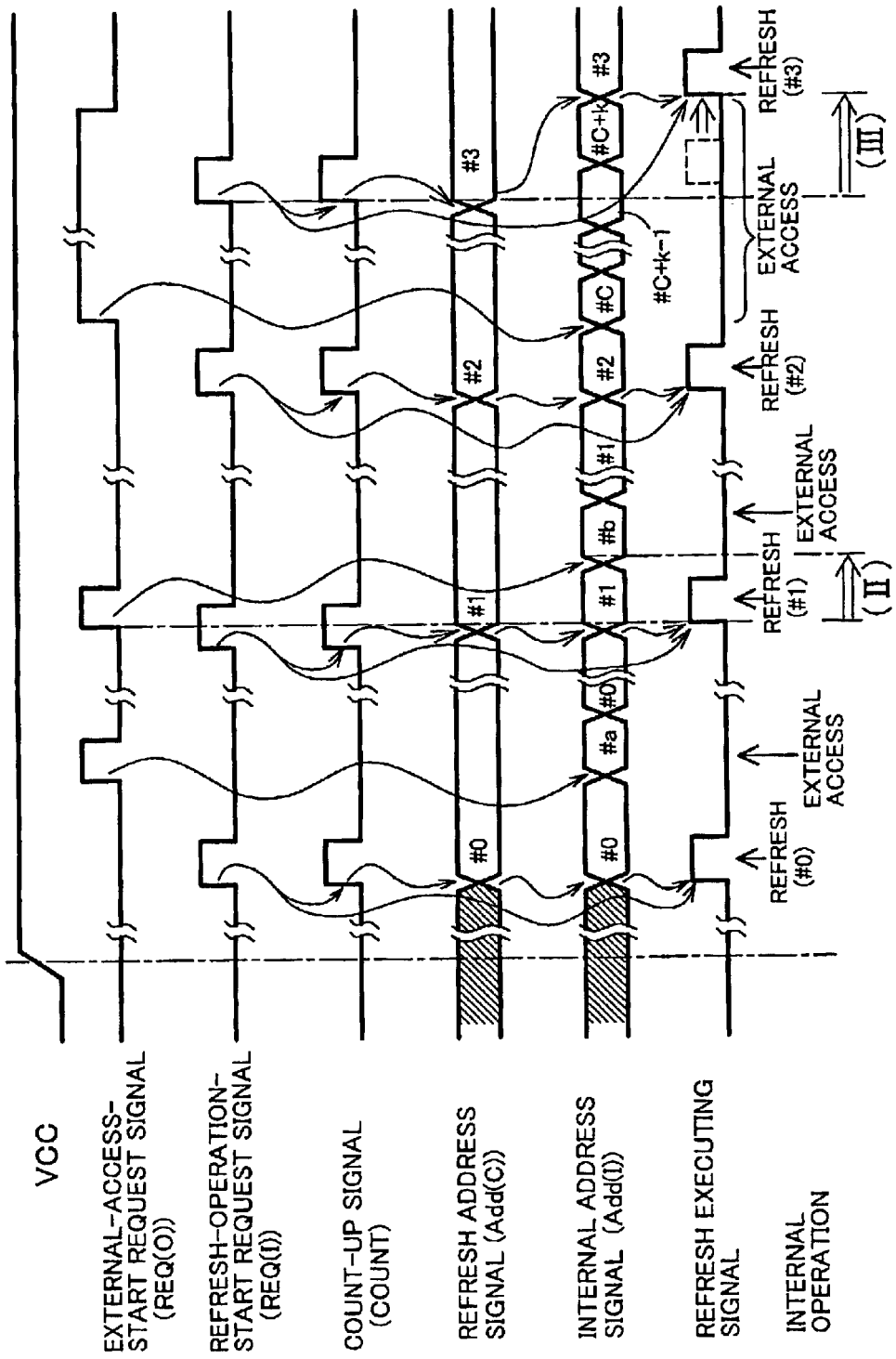
FIG. 11 is a timing chart showing the refresh operation (2) of the related art.
Figure 12:
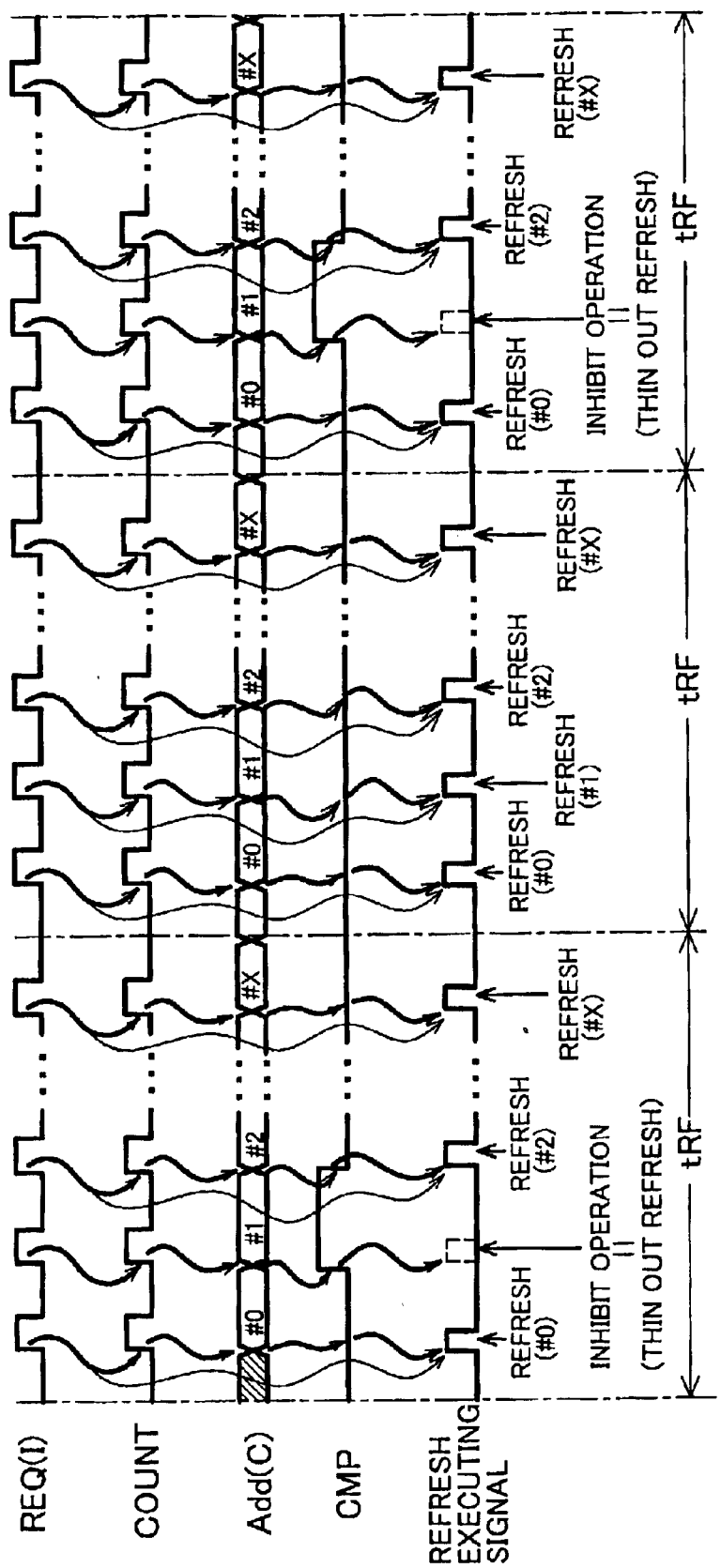
FIG. 12 is a timing chart showing a refresh-thinning-out operation.
Figure 13:
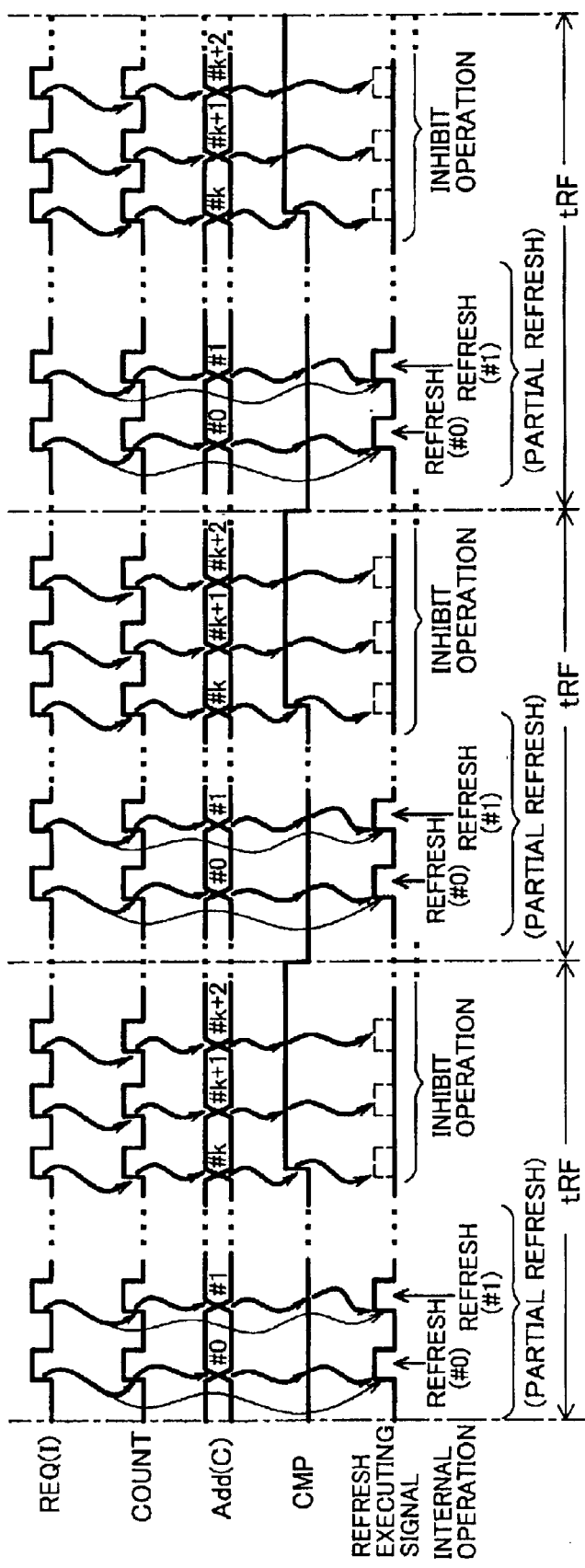
FIG. 13 is a timing chart showing a partial refresh operation.

FIG. 9 is an operation timing chart of the second embodiment showing the refresh operation control under the setting of the external-access operation priority mode. In FIG. 9, the operation timing chart under the same condition as FIG. 15 for the second problem of the related art is illustrated.

While the external-access operation priority mode is set with the predetermined external terminal or the predetermined command or the like, the refresh-operation-start request signal REQ (I) is outputted twice ((IV), (V) of FIG. 9). Since the count-up signal COUNT of the high logic level is outputted for the first refresh-operation-start request signal REQ (I) ((IV) of FIG. 9), the refresh address counter 26 executes the count-up operation to increment the refresh address signal Add (C) to #1 from #0. However, since the external-access operation priority mode is being set, the refresh-operation-execution inhibiting signal INH (I) is inputted to the access arbiter 33 to inhibit the refresh operation. Therefore, the refresh operation for the refresh address #1 is not executed.

Moreover, since the external-access-state signal ST (O) set by the refresh-operation-execution inhibiting signal INH (I) is inputted to the count-up monitoring circuit 25, output of the count-up signal COUNT is controlled for the second refresh-operation-start request signal REQ (I) ((V) of FIG. 9). Therefore, the refresh address counter 26 does not execute the count-up operation and the refresh address signal Add (C) is continuously set to the address #1. This condition is also maintained for output of the third and subsequent refresh-operation-start request signals REQ (I) and the refresh address signal Add (C) is also maintained to the address #1 during the period in which the external-access operation priority mode is set.

The refresh operation for the refresh address #1 which has been inhibited during the external-access operation priority mode setting period is executed upon completion of the external successive access operation. In more practical, this refresh operation is executed when the access arbiter 33 which has detected the completion of the refresh-operation-execution inhibiting signal INH (I) outputs the access trigger signal TG for the refresh operation. In this case, the refresh address signal Add (C) has the address #1 which is set by the first refresh-operation-start request signal REQ (I) during the external successive access operation and the refresh operation which has been inhibited during the external-access operation priority mode setting period is executed upon cancellation of the external-access operation priority mode. In FIG. 9, a new refresh-operation-start request signal REQ (I) is outputted in this timing. In this case, it is possible to set the execution of the refresh operation of the refresh address #2 under the control of the access arbiter 33 or the like by controlling an output of the count-up signal COUNT with the count-up monitoring circuit 25 following the execution of the refresh operation for the refresh address #1.

As explained above in detail, according to the first and second embodiments, even in the period for the external access operation such as the external successive access operation or the like which is executed with priority to the refresh operation and in the period for the external-access operation priority mode setting in which the refresh operation is inhibited depending on the setting from an external circuit, the control condition of internal operation of the refresh address counter 26 required for the refresh operation is held as required and thereby the subsequent refresh operation can surely be executed.

Namely, even when the second and subsequent refresh-operation-start request signal REQ (I) is generated, the count-up signal COUNT cannot be outputted with the second and subsequent refresh-operation-start request signal REQ (I) and a value of the refresh address signal Add(C) of the refresh address counter 26 is never replaced. With an output of accurate count-up signal COUNT, the refresh operation which has been inhibited during execution of the external access operation and during the setting of the external-access operation priority mode and then executed after the completion of the external access operation and the cancellation of the external-access operation priority mode and the refresh operation is executed for all refresh address signals Add (C) and the refresh operation is always surely executed.

In these refresh operation control, the refresh operation can be executed only for the refresh operation which requires the refresh operation and unnecessary refresh operation can be avoided for the refresh operation specification including the refresh addresses for which the refresh operation such as a refresh-thinning-out operation and a partial refresh operation is not executed. In the refresh-thinning-out operation and partial refresh operation, the refresh addresses for which the refresh operation is necessary are previously determined as required depending on the data holding ability. Thereby, the appropriate data holding ability can be obtained with the required minimum refresh operation and unnecessary refresh operations can be eliminated.

The present invention is not limited to the above embodiments and allows various amendments and modifications within the scope not departing from the claim.

For example, in the embodiments of the present invention explained above, an example of the count-up operation of the refresh address counter 26 is explained as the internal operation to be previously executed prior to the execution of the actual refresh operation for the refresh-operation-start request signal REQ (I) and the control of the count-up signal COUNT for count-up is controlled. However, the present invention is not limited thereto and can also be applied to any other control operation to be executed previously.

According to the present invention, it is possible to provide a semiconductor memory device and a refresh control method thereof in which the refresh operation which executes an internal access operation different from the external access operation can surely be realized without any problem applied on the external access operation while the low current dissipation operation such as the refresh-thinning-out operation and partial refresh operation is executed.

What is claimed is:

1. A refresh control method for a semiconductor memory device in which a refresh operation is executed internally and automatically, comprising:

enabling execution of an external access operation, the external access operation being based on an external request and executed with priority to the refresh operation;

monitoring the number of generations of a refresh operation start request during the execution of the external access operation; and inhibiting an internal operation of the refresh operation when the number of generations of the refresh operation start request is two or more.

2. The refresh control method of claim 1, wherein controlling an internal operation comprises:

controlling generation of refresh address.

3. The refresh control method of claim 2, further comprising:

generating a refresh address during execution of the external access operation; and executing a refresh operation for the generated refresh address after completion of the external access operation.

4. The refresh control method of claim 2, further comprising:

generating a refresh address for every generation of the refresh operation start request;

for each generated refresh address, determining whether a refresh operation will be executed; and for each generated refresh address, if it has been determined that a refresh operation will be executed, executing the refresh operation.

5. The refresh control method of claim 4, wherein, for each generated refresh address, determining whether a refresh operation will be executed comprises:

determining whether the generated refresh address is a predetermined address.

6. The refresh control method of claim 5, wherein the predetermined address is selected based on data holding ability.

7. The refresh control method of claim 1, wherein the external access operation comprises a plurality of successive external access operations.

8. A refresh control method for a semiconductor memory device in which a refresh operation is executed internally and automatically, comprising:

enabling execution of an external access operation, the external access operation being based on an external request and executed with priority to the refresh operation;

inhibiting execution of the refresh operation during the execution of the external access operation;

monitoring the number of generations of a refresh operation start request during the period in which execution of the refresh operation is inhibited; and inhibiting an internal operation of the refresh operation when the number of generations of the refresh operation start request is two or more.

9. The refresh control method of claim 8, wherein the external request comprises at least one control signal or at least one predetermined command to a control terminal.

10. A semiconductor memory device in which a refresh operation is conducted automatically, comprising:

an external access determiner for determining whether an external access operation is being executed;

a signal generator for outputting a refresh-operation-start request signal;

a monitor means for monitoring the number of generations of the refresh-operation-start request signal when the external access determiner determines that an external access operation is being executed; and an inhibitor for inhibiting an internal operation of the refresh operation when the number of generations of the refresh-operation-start request signals are two or more.

11. The semiconductor memory device of claim 10, wherein the external access determiner determines whether an external access operation is being executed based on an external setting that inhibits execution of the refresh operation.

12. The semiconductor memory device of claim 10, further comprising:

a refresh address counter for determining a refresh address, wherein controlling an internal operation comprises:

controlling generation of a count-up command to be provided to the refresh address counter.

13. The semiconductor memory device of claim 12, further comprising:

a memory unit for storing a refresh-inhibiting address; and a refresh-address arbitrating circuit for comparing a refresh address outputted from the refresh address counter with the refresh-inhibiting address and for controlling execution of the refresh operation based on the results of the comparison.

14. The memory device of claim 13, wherein the refresh address arbitrating circuit does not execute the refresh operation when a condition is met, the condition being selected form a group consisting of:

a condition in which the refresh address matches the refresh-inhibiting address; and a condition in which the refresh address matches the refresh-inhibiting address and the elapsed time since the last refresh operation for the refresh address is less than a predetermined refresh period.

15. The semiconductor memory device of claim 10, wherein the external access operation comprises a plurality of successive external access operations.

16. A semiconductor memory device in which a refresh operation is conducted automatically, comprising:

a refresh inhibition determiner for determining inhibition of the refresh operation based on an external execution-inhibiting setting:

a signal generator for outputting a refresh-operation-start request signal;

a monitor for monitoring the number of generations of the refresh-operation-start request signal when the refresh inhibition determiner determines inhibition of the refresh operation; and an inhibitor for inhibiting an internal operation of the refresh operation when the number of generations of the refresh-operation-start request signals are two or more.

17. A semiconductor memory device according to claim 16, wherein the external execution-inhibiting setting comprises at least one control signal or at least one predetermined command to a control terminal.

* * * * *